United States Patent
Tao et al.

(10) Patent No.: US 7,768,003 B2
(45) Date of Patent: Aug. 3, 2010

(54) FORMATION OF P-N HOMOGENEOUS JUNCTIONS

(75) Inventors: Meng Tao, Colleyville, TX (US); Longcheng Wang, Arlington, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 11/855,568

(22) Filed: Sep. 14, 2007

(65) Prior Publication Data

US 2009/0072231 A1   Mar. 19, 2009

(51) Int. Cl.
*H01L 29/10* (2006.01)
(52) U.S. Cl. .......... 257/43; 257/E21.002; 257/E29.068; 438/85; 438/104
(58) Field of Classification Search .................. 257/43, 257/E21.002, E29.068; 438/85, 104
See application file for complete search history.

(56) References Cited

FOREIGN PATENT DOCUMENTS

JP   2003324206 A   * 11/2003

OTHER PUBLICATIONS

W Siripala and K Kumara, "A photo-electrochemical investigation of the n- and p-type semiconducting behaviour of copper (I) oxide films", Jan. 6, 1989, Semicond. Sci. Technol. 4 (1989) 465-468.*

A. Survila, P. Kalinauskas, and I. Valsiunas, "Effect of Ligand on Formation of Photosensitive Oxide Layers on Copper Electrode", Russian Journal of Electrochemistry, vol. 38, No. 10, 2002, pp. 1168-1191.*

Wang, Longcheng, Tao, Meng, "Fabrication and Characterization of p-n Homojunctions in Cuprous Oxide by Electrochemical Deposition," Electrochemical and Solid-State Letters, vol. 10, Issue 9, pp. 248-250, Jun. 15, 2007.

* cited by examiner

*Primary Examiner*—Davienne Monbleau
*Assistant Examiner*—Shweta Mulcare
(74) *Attorney, Agent, or Firm*—Chowdhury & Georgakis, P.C.

(57) ABSTRACT

Methods, structures and devices are described, in which structures and devices have one or more p-n homo-junctions fabricated in solution. The junctions are formed by a sequential deposition of an oxide of copper from solution. Conduction type of the oxide of copper is controlled by pH of the solution.

19 Claims, 11 Drawing Sheets

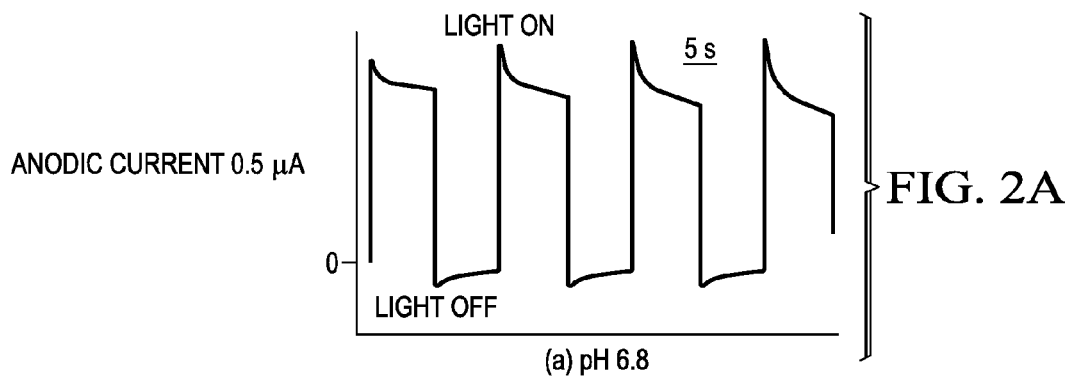
FIG. 2A (a) pH 6.8
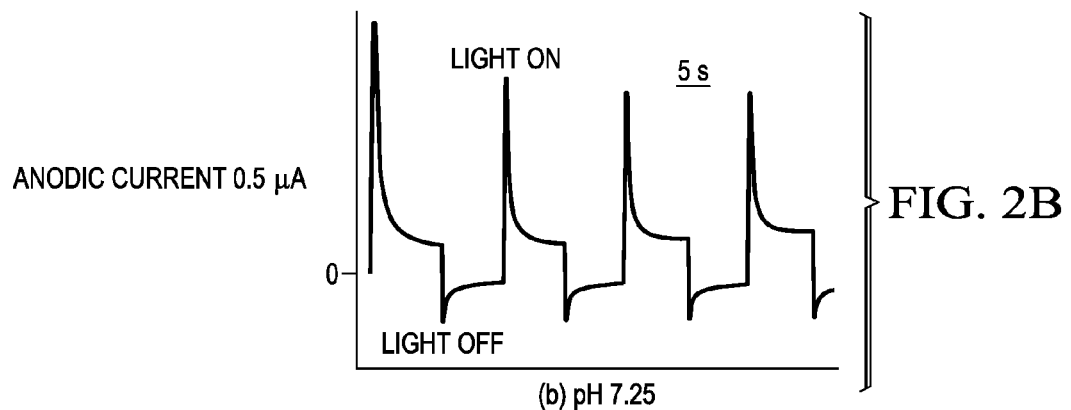
FIG. 2B (b) pH 7.25
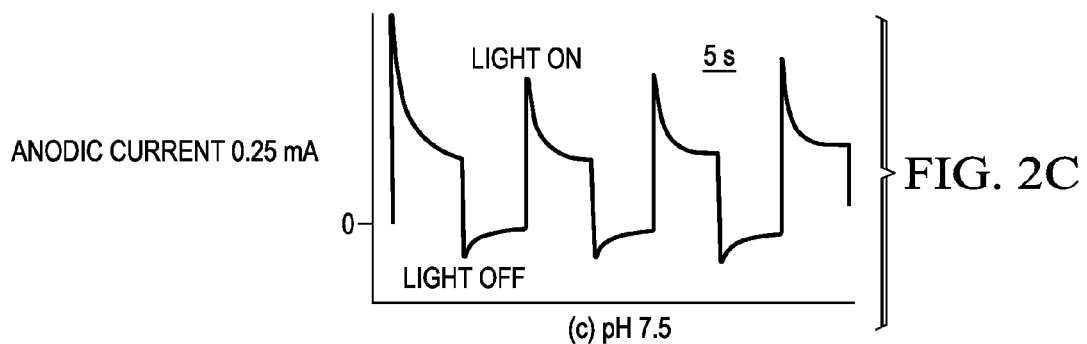
FIG. 2C (c) pH 7.5
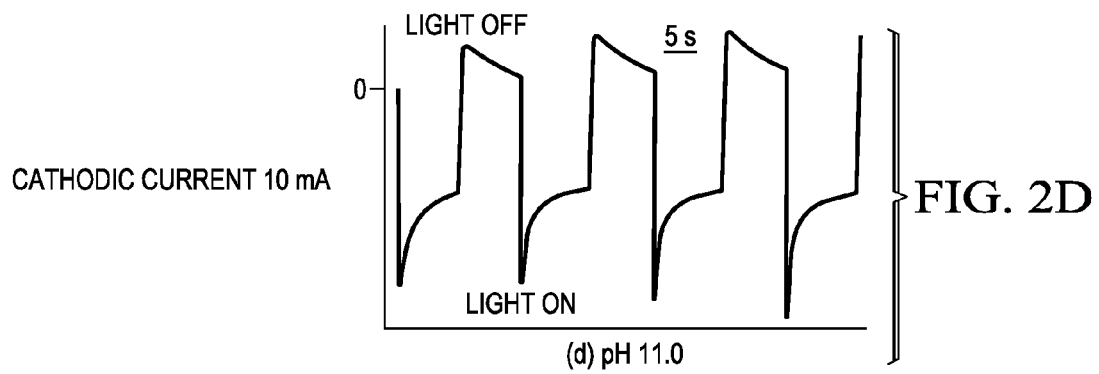
FIG. 2D (d) pH 11.0

FIG. 7A
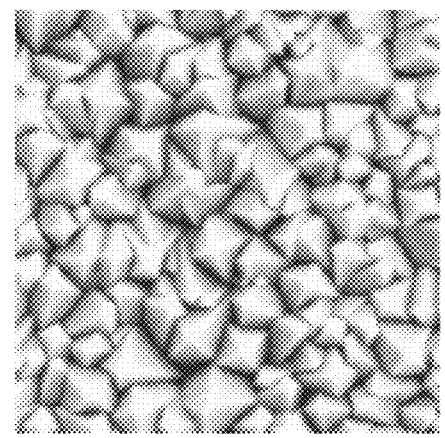
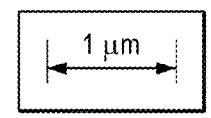
FIG. 7B
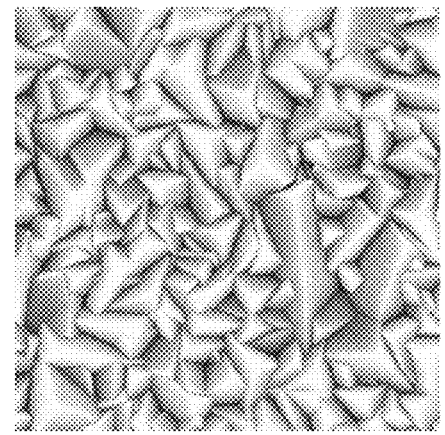
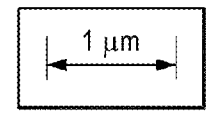
FIG. 7C
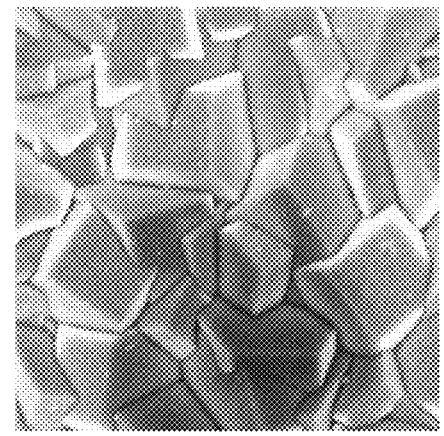
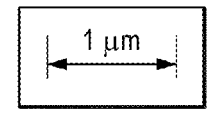

FORMATION OF P-N HOMOGENEOUS JUNCTIONS

CROSS-REFERENCES TO RELATED APPLICATION

Not applicable.

STATEMENT REGARDING FEDERALLY SPONSORED RESEARCH OR DEVELOPMENT

Not applicable.

BACKGROUND OF THE INVENTION

As described, the invention relates generally to the field of semiconductor fabrication and engineering and in particular to formation of p-n homogeneous junctions from a solution.

There is an absence of p-n homogeneous junctions with semiconducting metal oxides because most semiconducting metal oxides are intrinsically dominated by one type of charge carrier, such that a particular metal oxide is either n-type or p-type. As a result, formation of a p-n junction using a semiconducting metal oxide is typically made of two different semiconducting metal oxides. For example, n-type zinc oxide (ZnO) is deposited on p-type cuprous oxide ($Cu_2O$) to form a heterogeneous p-n junction (hetero-junction). Unfortunately, when such hetero-junctions are used in photovoltaic solar cells, they have a low conversion efficiency. A solar cell made on a $ZnO/Cu_2O$ p-n hetero-junction has only a 2% efficiency.

SUMMARY OF THE INVENTION

The invention described overcomes one or more disadvantages described above. In one form, as provided herein, a method of controlling conduction type (n- or p-type) of an electrochemically-deposited oxide of copper (e.g., cuprous oxide or cupric oxide), is described. The conduction type is controlled in a solution. For cuprous oxides, deposition at a solution pH below about 7.5 was suitable to form n-type semiconductors. Cuprous oxides deposited at a solution pH above about 9.0 were found to be p-type semiconductors.

In addition, as described, are methods to control conduction type of a semiconducting oxide of copper. This includes methods of forming p-n homogeneous junctions (referred to herein as homo-junctions) with a p-type and n-type semiconducting oxide of copper, wherein the same metal oxide is used. By changing conditions for deposition of the same metal oxide, the invention described controls atomic ratio of metal ions to oxygen ions in the as-deposited film. Such control is best performed in solution. Under such condition, native point defects and conduction type of the as-deposited film are managed. Films, structures and devices are formed, which comprise such as-deposited metal oxide films, are further provided.

Further methods for deposition of p-type and n-type oxides of copper are provided. In one or more embodiments, the methods include a two-step process to form a p-n homo-junction of a single oxide of copper, thereby forming a p-n homo-junction. Such methods are easy to provide in larger scale and high throughput. As such, the devices provided are lost cost, large size and offer high performance/efficiency.

Still further, a p-n homo-junction formed on a substrate surface is described. The junction includes a first oxide of copper deposited on a surface of a substrate, a second oxide of copper deposited on the first. The first and second oxides are the same oxide of copper. The first and second oxides are deposited in solution. In one form, the first oxide of copper is deposited as p-type and the second oxide of copper is deposited as n-type. The reverse may also be performed. The p-type as-deposited oxide of copper may be polycrystalline or amorphous. The n-type as-deposited oxide of copper may be amorphous or polycrystalline. After deposition, the substrate may be further processed to form a solar cell, a solid-state device, a high performance electronic device and/or an optoelectronic device.

Other embodiments include a device which includes a first oxide of copper deposited on a surface of a substrate and a second oxide of copper deposited on the first. The first oxide of copper may be deposited as p-type and the second deposited as n-type; however, the reverse may also occur. In either instance, the first and second films or layers are the same metal oxide. Both oxide of copper are deposited in a solution, the solution purposely selected to deposit the requisite conduction type. The device when further processed may be a solar cell, a solid-state device, an electronic device and/or an optoelectronic device.

Still other embodiments include a method for forming a p-n homo-junction that includes depositing a first oxide of copper on a surface of a substrate and depositing a second oxide of copper on the first. The interface between the first and second oxides of copper forms a p-n homo-junction and the first and second oxides of copper are the same. Deposition is performed in solution; the pH of the solution determines conduction type of the formed film. With some copper oxides, the first is deposited at a basic pH (e.g., greater than 9.0) and the second is deposited at a more acidic pH (e.g., less than 7.5) or vice versa. The utility as described is that either conduction type may be selectively predetermined and driven by the solution pH.

Yet additional embodiments include a device having one or more p-n homo-junctions. The device is formed in part by a sequential deposition of an oxide of copper in solution. Deposition is on at least one surface of a substrate of the device and performed in solution. Controlling the pH of the solution effects the conduction type of the oxide of copper.

In other embodiments are provided a method of forming a device having one or more p-n homo-junctions. The method includes a sequential deposition of an oxide of copper in solution. Deposition is on at least one surface of a substrate of the device and performed in solution. Controlling the pH of the solution effects the conduction type of the formed film.

Several suitable applications results from methods and devices described herein. Applications include solid-state and high performance electronics and optoelectronics. Devices may further include photovoltaic devices, solar cells and others.

Those skilled in the art will further appreciate the above-noted features and advantages of the invention together with other important aspects thereof upon reading the detailed description that follows in conjunction with the drawings.

BRIEF DESCRIPTION OF THE FIGURES

For more complete understanding of the features and advantages of the present invention, reference is now made to the detailed description of the invention along with the accompanying figures, wherein:

FIGS. 2A-2D depict representative photocurrent responses of different cuprous oxide films deposited at a pH of (A) 6.8, (B) 7.25, (C) 7.5, and (D) 11.0;

FIGS. 7A-7C depict representative scanning electron microscope (SEM) images showing surface morphology for electrochemically-deposited cuprous oxide films with crystal orientations of (A) (100), (B) (110) and (C) (111);

DETAILED DESCRIPTION OF THE INVENTION

The invention, as defined by the claims, may be better understood by reference to the following detailed description. The description is meant to be read with reference to the figures contained herein. This detailed description relates to examples of the claimed subject matter for illustrative purposes, and is in no way meant to limit the scope of the invention. The specific aspects and embodiments discussed herein are merely illustrative of ways to make and use the invention, and do not limit the scope of the invention.

As described herein, fabrication of n-type and p-type semiconducting oxides of copper on substrates are provided. Fabrication includes sequential deposition of an oxide of copper and formation of a p-n homo-junction of the same semiconducting oxide of copper. Deposition is performed in a solution. In solution, aqueous solutions are preferred for several reasons, including economical and ecological advantages, the flexibility to tailor the end properties and the homogeneous metal ion distribution in the end product.

The fabrication described uses a large percentage of the source materials and has the capability to control the chemical phases, microstructures and physical properties of the materials deposited. The deposited films are of high quality. Moreover, deposition is be on any conducting substrate without use of vacuum, without microcracks and is suitable even with irregular surfaces.

Oxides of copper include cupric oxide (CuO) and cuprous oxide ($Cu_2O$)—which is non-toxic and from source materials of high abundance. Cuprous oxide is particularly useful for photovoltaic solar cell applications due to its suitable band gap. Unfortunately, the best reported conversion efficiency from $Cu_2O$-based solar cells is about 2%, while the theoretical efficiency for $Cu_2O$ solar cells is about 20%. The low efficiency has been attributed to hetero-junctions used in the solar cells, in which the interface between p-type $Cu_2O$ and second material is a source of significant loss in photo-carrier separation and collection.

Described herein is a method to control the conduction type of oxides of copper and fabricate a p-n homo-junction of such copper oxides. For oxides of copper, such as cuprous oxide, copper vacancies are believed to be the cause for its p-type conductivity. In solution, the inventors have found that pH of the solution may control the amount of oxygen incorporated into the metal oxide film during electrochemical deposition (see L. C. Wang, et al., Thin Solid Films, 2007; 515:3090 for added description, incorporated herein by reference). This was taken to indicate that by reducing the amount of oxygen incorporated, low pH of a solution may suppress copper vacancies and populate oxygen vacancies in cuprous oxide. Consequently, the conduction type of cuprous oxide may change from p-type to n-type.

Figure 10A:
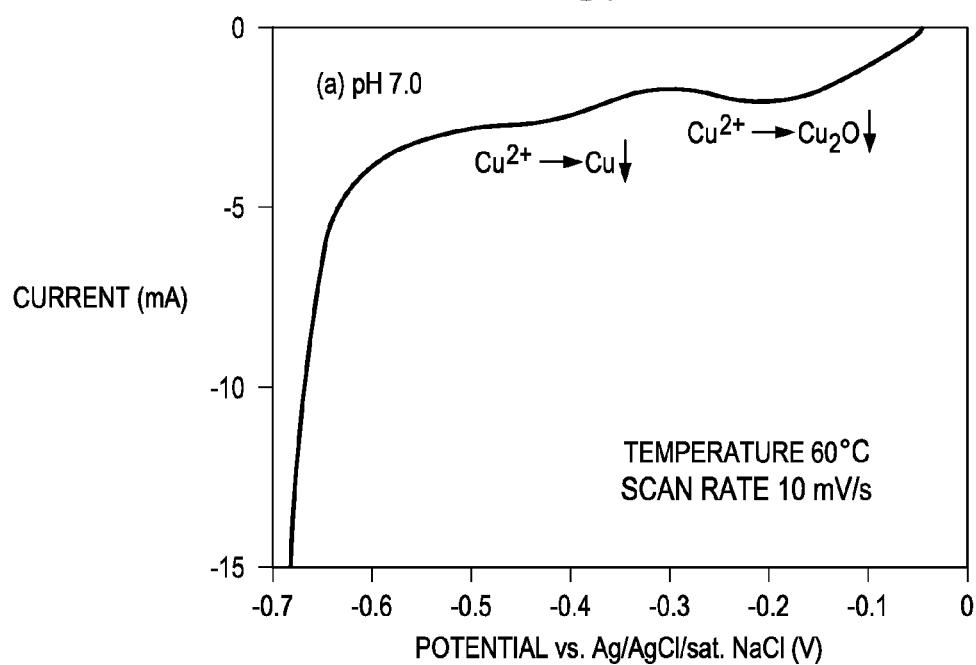
FIGS. 10A-10B depict linear sweep voltmammograms for solutions with (A) pH of 7.0 and (B) pH of 9.0.
Figure 10B:
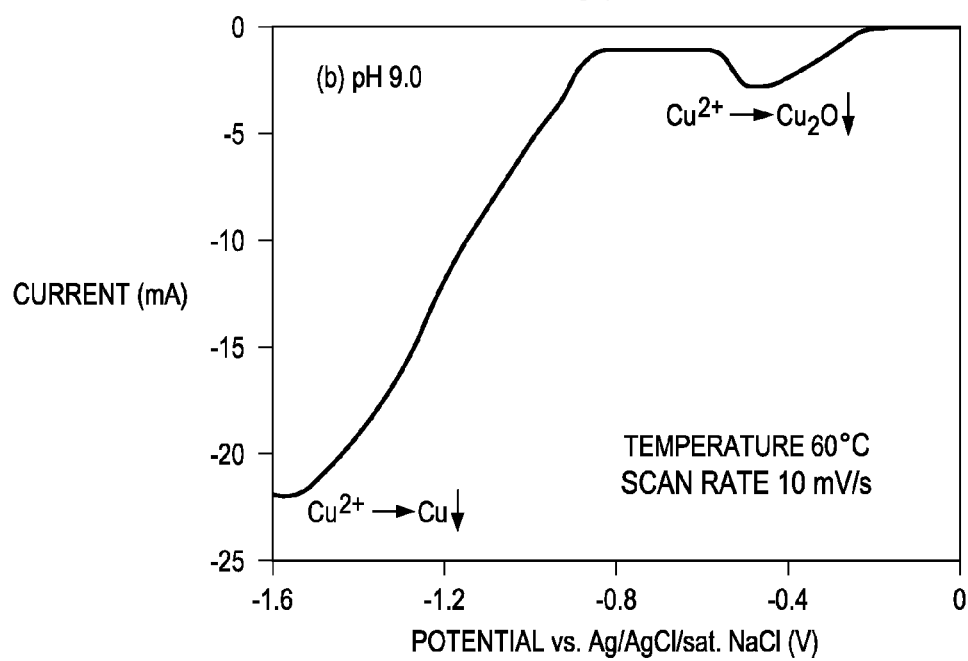

In one example, cuprous oxide deposition relied on a three-electrode electrochemical cell that had a platinum foil as a counter electrode, a silver/silver chloride/saturated sodium chloride as a reference electrode (to which all other applied potentials are referred to), and a working electrode. Here, the working electrode was a copper foil (approximately 99.9% pure). Prior to deposition, the copper foil was degreased in acetone, etched (e.g., in diluted nitric acid), and rinsed in de-ionized water. Cuprous oxide films were electrochemically deposited from a solution containing 0.4 M copper(II) sulfate and 3 M lactic acid. The pH of the solution was adjusted to between about 6.5 and 12.0 by addition of 4 M sodium hydroxide. For electrochemical measurement, linear-sweep voltammetry was performed with different solutions each having a different pH. Voltammetric data (FIGS. 10A and 10B) indicated that a potential for cuprous oxide deposition was between about −0.15 V and −0.25 V for a solution with a pH of 7.0. For a solution with a pH of 9.0, the deposition potential was between about −0.35 V and −0.55 V. For samples deposited at a pH below 7.5, a constant potential of −0.20 V was applied; for samples deposited at a pH above 9.0, a constant potential of −0.40 V was applied. Deposition time was at least about 30 to 60 minutes for a lower pH below (e.g., about 7.5 or less) and less (e.g, about 10 to 20 minutes) for a higher pH (e.g., at or greater than about 9.0). The solution temperature was kept constant. For cuprous oxide, the solution temperature was kept at about 60° C. to achieve large crystal grains.

After deposition, photocurrent and capacitance-voltage (C-V) measurements were performed to characterize conduction type of the formed cuprous oxide films. C-V measurements were performed in a three-electrode cell; cuprous oxide film was the working electrode and the reference electrode was silver/silver chloride/saturated potassium chloride. A non-aqueous solution was used for C-V that contained 0.1 M tetrabutylammonium hexafluorophosphate in acetonitrile. Photocurrent characterization was also carried out in a three-electrode cell; the working electrode was a cuprous oxide film facing a light source (e.g., a broad-spectrum 100 W tungsten/halogen lamp). A counter electrode was a platinum foil and the reference electrode was silver/silver chloride/saturated potassium chloride. A solution containing 0.5 M sodium sulfate and 0.1 M sodium formate was used. A polarographic analyzer/stripping voltammeter was used to control applied potential and scan rate. For current-voltage (I-V) characterization, using a semiconductor parameter analyzer, aluminum was deposited as a top electrical contact through a shadow mask with a circular dot area of $3.6 \times 10^{-4}$ $cm^2$.

In one embodiment, deposition of p-type and n-type cuprous oxide was a two step process. After sequential deposition, a p-n homo-junction of cuprous oxide was formed, confirmed by photocurrent measurement.

It is unclear how deposition of cuprous oxide occurs electrochemically. It is suggested that deposition proceeds in two steps. A first step may involve reduction of copper(II) ($Cu^{2+}$) ions to copper(I) ($Cu^+$) in solution, which breaks the copper-lactic complex:

$$Cu^{2+}+e^-\rightarrow Cu^+ E°=0.153 \text{ V (standard hydrogen electrode)} \quad (1).$$

The $Cu^+$ ions undergo a hydrolysis reaction:

$$2Cu^++2OH^-\rightarrow Cu_2O\downarrow+H_2O \quad (2).$$

However, the fact that the deposition potential is found to be pH sensitive (e.g., FIGS. 10A and 10B) suggests the following reaction is possible:

$$2Cu^{2+}+2OH^-+2e\rightarrow Cu_2O\downarrow+H_2O \quad (3).$$

Yet, even Reaction (3) does not explain the large pH dependence of deposition potential. Instead, pH may determine the reaction conditions, such that Reaction (1) is valid with basic solutions and with neutral solutions (pH about 7.0), Reaction (3) may takes place.

Described herein are solution preparations at varying pH showing that conduction type of a cuprous oxide film changed with pH. After deposition, C-V and photocurrent measurements were applied to determine the conduction type of the cuprous oxide films. C-V data was analyzed with the Mott-Schottky theory as follows:

$$n\text{-type}: \frac{1}{C_{sc}^2} = \frac{2}{e\varepsilon\varepsilon_o A^2 N_D}\left(V - V_{fb} - \frac{kT}{e}\right) \quad (4)$$

$$p\text{-type}: \frac{1}{C_{sc}^2} = -\frac{2}{e\varepsilon\varepsilon_o A^2 N_A}\left(V - V_{fb} + \frac{kT}{e}\right), \quad (5)$$

where $C_{sc}$ represents capacitance of the space charge region, $\in$ is the dielectric constant of the semiconductor, $\in_o$ is permittivity of the free space, A is the area of the working electrode, $N_D$ and $N_A$ are donor and acceptor concentrations, V is applied potential, and $V_{fb}$ is flat-band potential. Apparently, the conduction type may be identified by the sign of its Mott-Schottky plot ($1/C^2$ vs. V plot); a positive slope indicates an n-type semiconductor, while a negative slope points to a p-type semiconductor. Representative Mott-Schottky plots for samples deposited in solutions with pH of 6.8, 7.25, 7.5, and 11.0 are presented in FIG. 1. As depicted, depositions at a pH below 7.5 led to a positive slope (indicating an n-type semiconductor). Deposition at a pH of 11.0 led to a negative slope (indicating a p-type semiconductor).

Photocurrent characterization verified the conduction type of the formed cuprous oxide films described with FIG. 1. Typically, a photocurrent generated upon illumination for n-type semiconductors is in an opposite direction from p-type semiconductors. Using FIG. 1 pHs for solution, photocurrent characterization are shown in FIG. 2. As depicted, deposition at a pH below 7.5 showed anodic photocurrents, indicating n-type conductivity. Deposition at a pH of 11.0 showed a cathodic photocurrent, indicating p-type semiconductor behavior. Consistent with the C-V data of FIG. 1, both photocurrent and C-V data demonstrate that solution pH controls the conduction type.

Figure 1A:
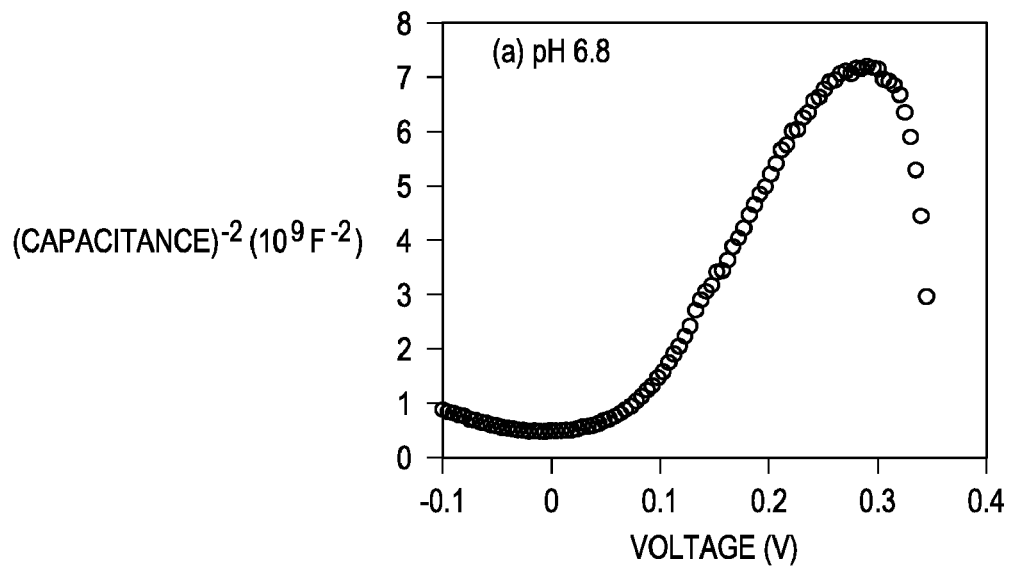
FIGS. 1A-1D depict representative Mott-Schottky plots of different cuprous oxide films deposited at a pH of (A) 6.8, (B) 7.25, (C) 7.5, and (D) 11.0.
Figure 1B:
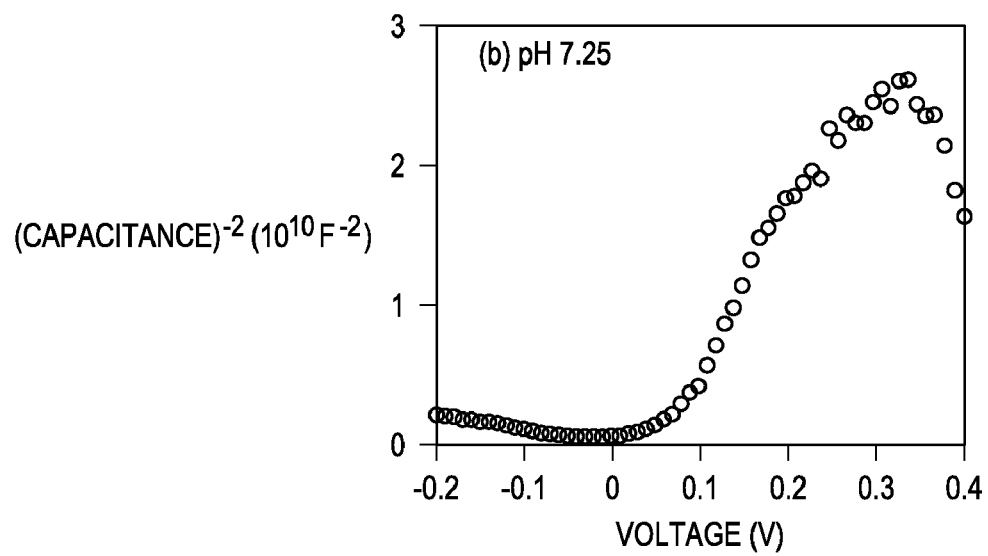
Figure 1C:
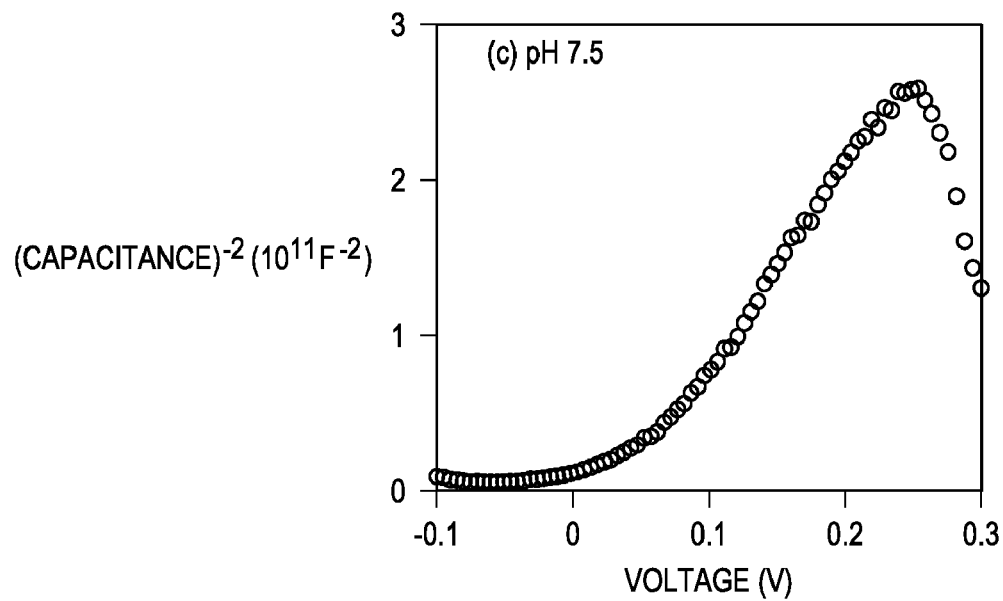
Figure 1D:
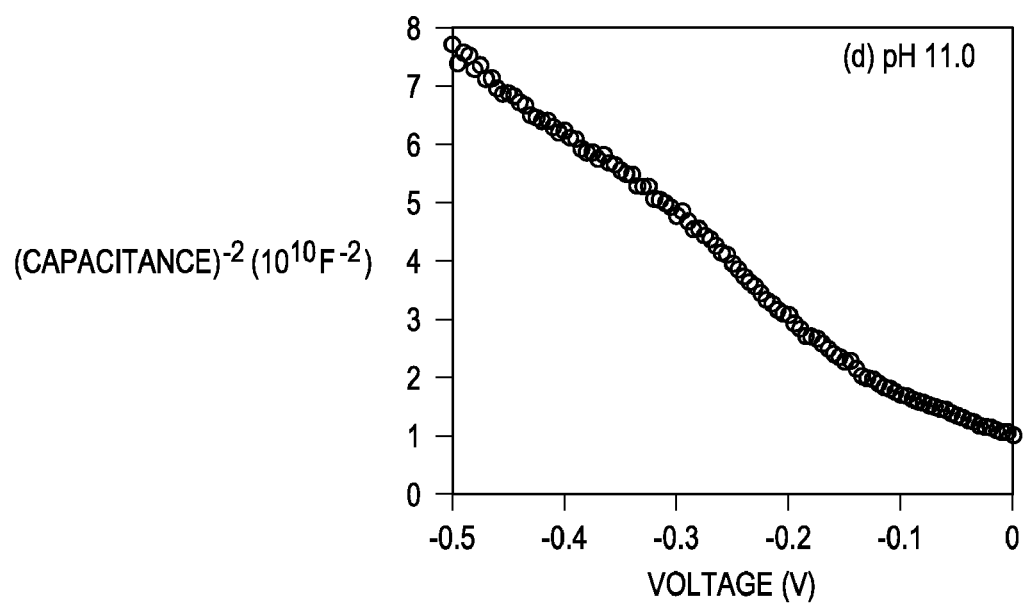
Figure 3A:
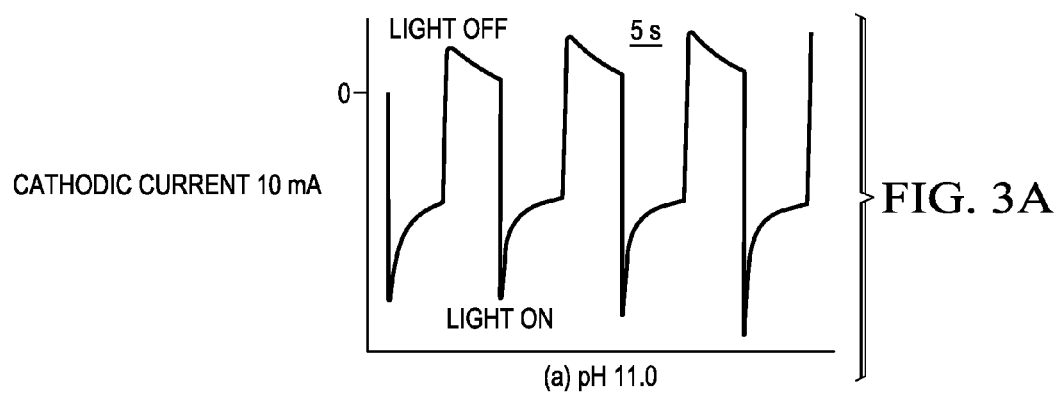
FIGS. 3A-3B depict representative photocurrents of (A) deposition at a pH of 11.0 and (B) two-layers of cuprous oxide, in which a first layer was deposited at 11.0 pH and a second layer was deposited at 7.5 pH.
Figure 3B:
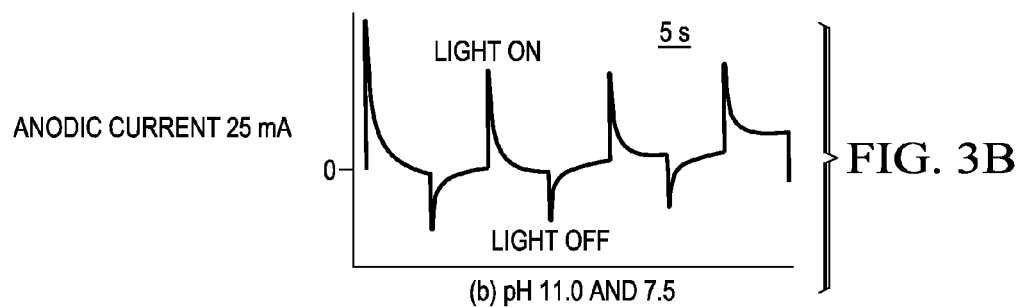

With both p-type and n-type cuprous oxides, a two-step deposition process was used to form a p-n homo-junction. In one example, p-type cuprous oxide was initially deposited at a pH of 11.0 on a copper substrate. This was followed by a direct deposition of n-type cuprous oxide onto the p-type cuprous oxide film at pH of 7.5 or less (e.g., 6.8, 7.25). Photocurrent measurements were performed after the initial deposition (e.g., at pH of 11.0) and after the second deposition (e.g., at pH of less than 7.5). FIG. 3 shows that cuprous oxide deposited at a pH of 11.0 had a typical p-type photocurrent response. After deposition of the second cuprous oxide film, the photocurrent response was that of an n-type semiconductor. Accordingly, n-type cuprous oxide was successfully deposited on p-type cuprous oxide, thereby forming a p-n homo-junction.

Figure 4A:
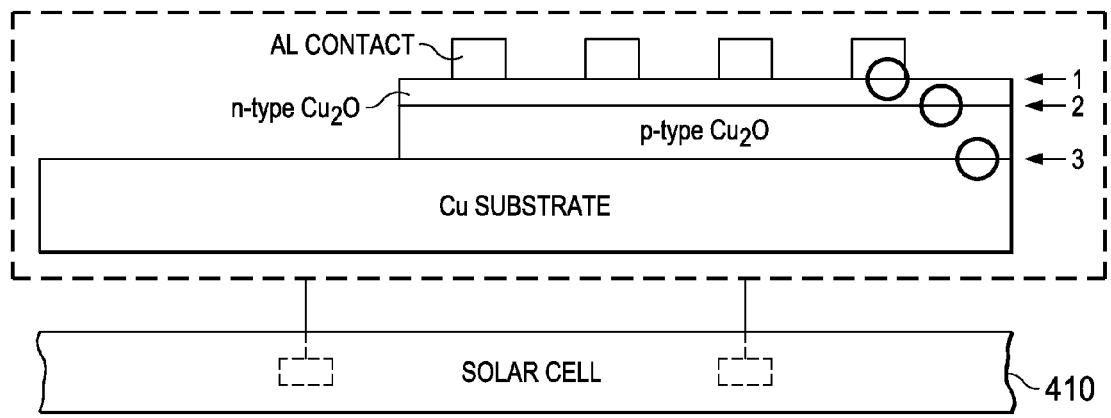
FIGS. 4A-4C illustrate (A) representative schematic of a p-n homo-junction structure in solar cell described herein, (B) current-voltage (I-V) characteristic of an aluminum/n-type cuprous oxide Schottky junction and (C) I-V characteristic of a copper/p-type cuprous oxide Schottky junction.
Figure 4B:
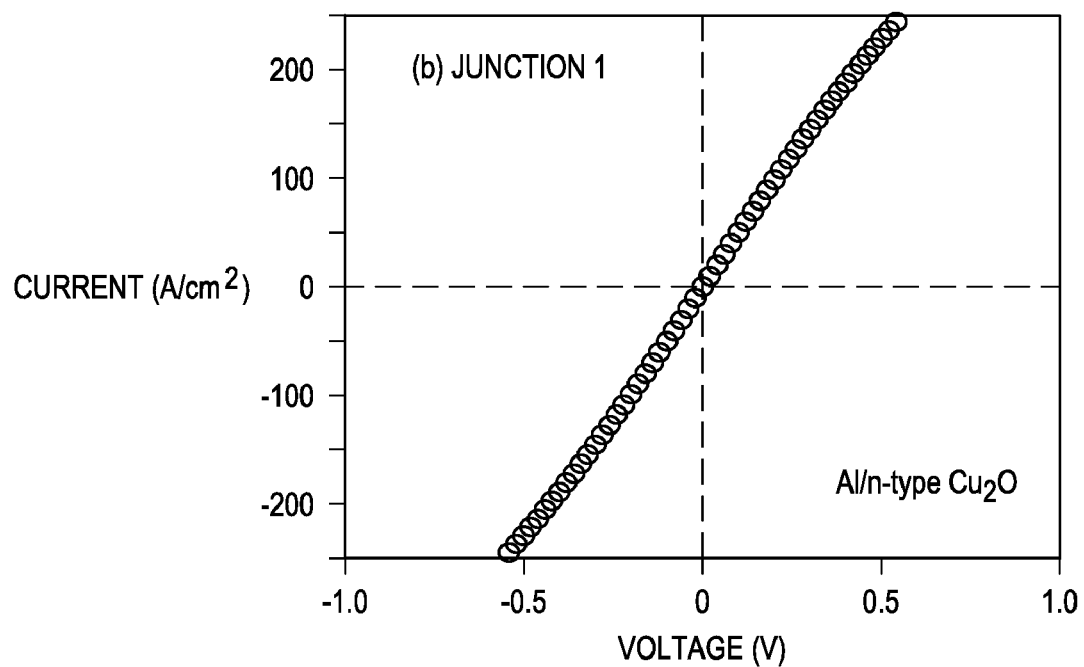
Figure 4C:
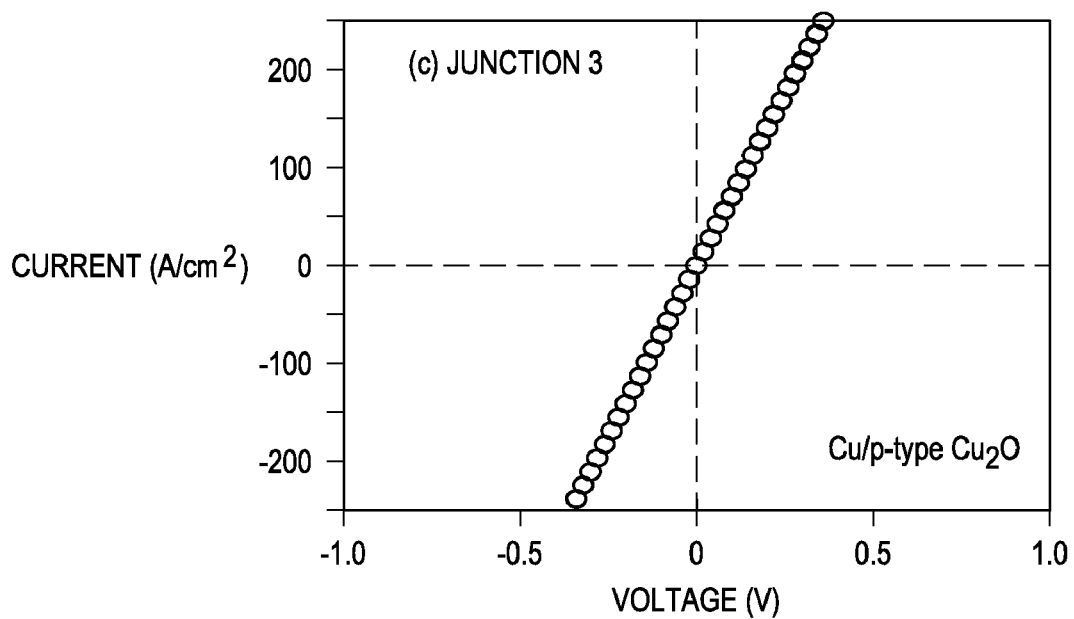

Aluminum top contacts were deposited through a shadow mask on several p-n homo-junctions and I-V characterization was performed. Referring now to the schematic structure in solar cell 410 depicted in FIG. 4A, three different junctions may promote rectifying I-V behavior: (1) a Schottky junction between an n-type cuprous oxide and top aluminum contact; (2) a p-n junction between n-type and p-type cuprous oxides; and (3) a Schottky junction between p-type cuprous oxide and copper substrate. Additional samples were prepared to determine I-V behavior of these junctions: p-type cuprous oxide on copper substrate with top copper contacts; and n-type cuprous oxide on copper substrate with top aluminum contacts. Such samples showed linear I-V relations in the current and potential ranges used (see FIGS. 4B and 4C) indicating any rectifying behavior from the structure of FIG. 4A would come from the p-n homo-junction of cuprous oxide itself.

Figure 5A:
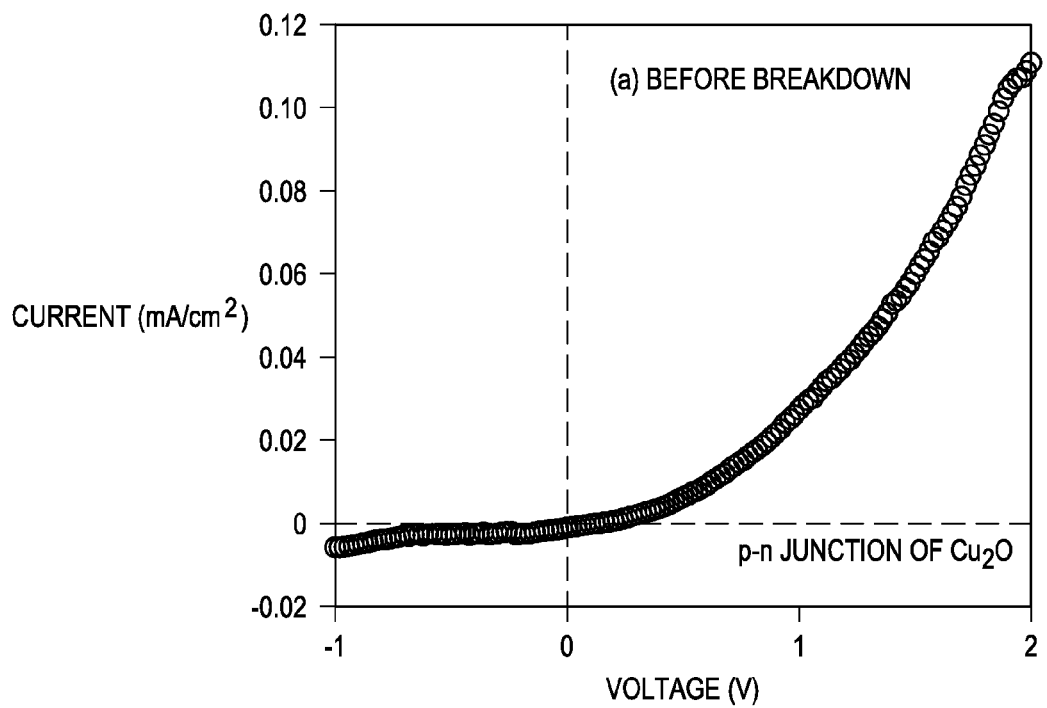
FIGS. 5A-5B depict representative I-V characteristics of a deposited cuprous oxide p-n homo-junction structure (A) before breakdown and (B) after breakdown.
Figure 5B:
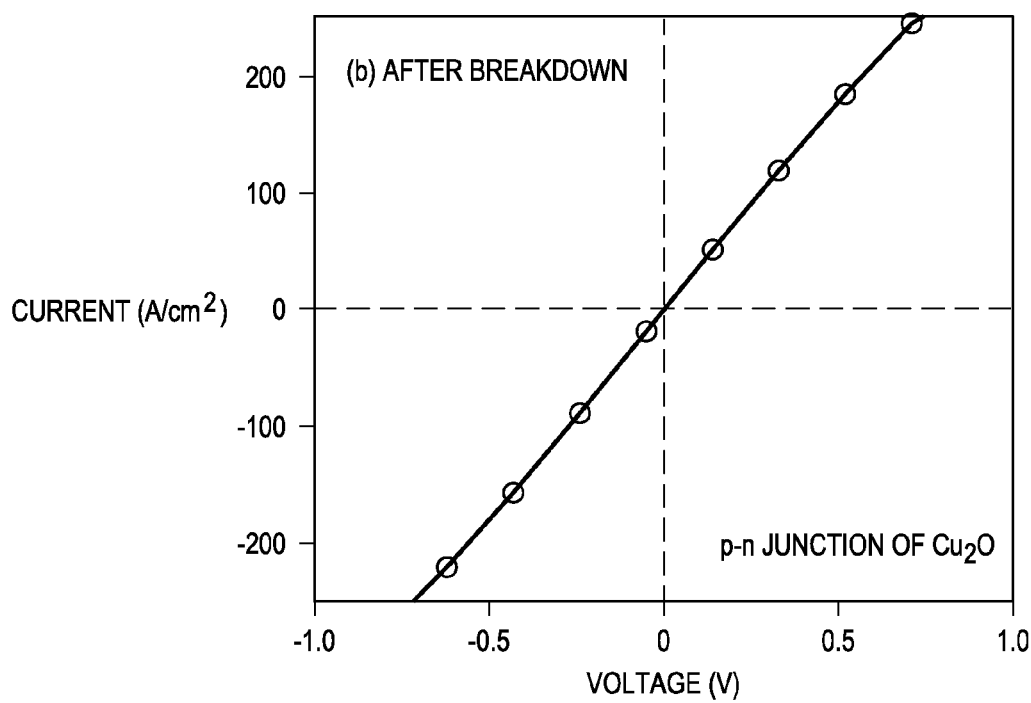

I-V results of a cuprous oxide p-n homo-junction before and after breakdown are shown in FIG. 5. FIG. 5A depicts the I-V curve before breakdown with a rectification effect of a p-n junction. The forward current through the junction increased quickly with increased applied potential. Under reverse bias, the current through the junction became much smaller. As the reverse bias passes around −6 V, the p-n junction was found to break down. After breakdown (FIG. 5B), I-V characteristic no longer displayed any rectification effect and the curve became linear. FIG. 5 demonstrates successful formation of a p-n homo-junction with cuprous oxide.

As such, described herein is formation of a p-n homo-junction from one or more solutions. Solution pH was found to control the conduction type in an electrochemically-deposited oxide of copper. Both p-type and n-type copper oxides were formed with a different solution pH. A film, structure and device thereof were subsequently formed as described herein. For a cuprous oxide film, deposition at a pH below about 7.5 provided an n-type semiconductor with n-type semiconductor behavior. At a solution pH above about 9.0, cuprous oxide was a p-type semiconductor with p-type semiconductor behavior. A two-step process was used to deposit p-type and n-type oxides of copper in sequence for the formation of a p-n homo-junction. Photocurrent measurements demonstrated successful deposition of n-type cuprous oxide on p-type cuprous oxide, and I-V characterization showed typical rectification behavior of a p-n junction for the fabricated structure, indicating that a p-n homo-junction of cuprous oxide has been achieved. Current-voltage measurements indicated that aluminum made ohmic contacts to n-type $Cu_2O$ and copper made ohmic contacts to p-type $Cu_2O$.

Crystal orientation of the $Cu_2O$ films (formed as described previously) were studied with a X-ray powder diffractometer (XRD) with Cu $K_\alpha$ radiation (1.54 Å). A scanning electron microscope (SEM) was used to characterize surface morphology of the $Cu_2O$ films with incident electron energy between 5 and 10 kV.

Figure 6:
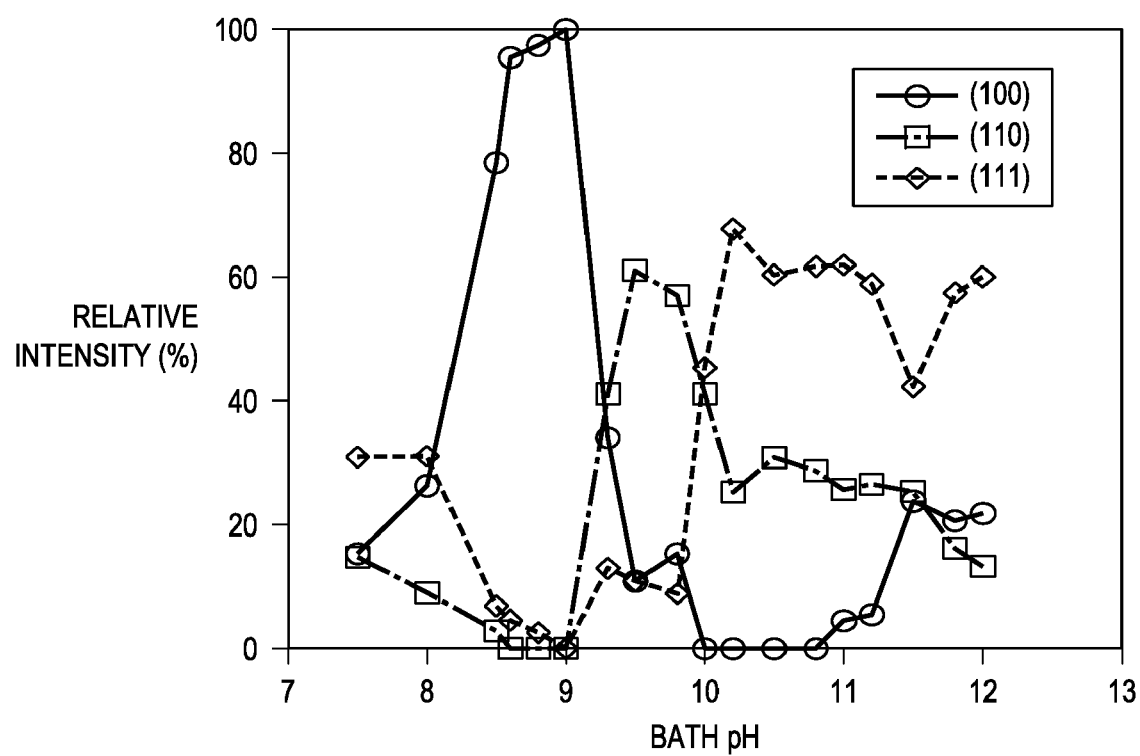
FIG. 6 depicts relative intensity as determined from X-ray diffraction (XRD) of different crystal orientations in electrochemically-deposited cuprous oxide films as a function of solution pH.

Electrochemically-deposited $Cu_2O$ films described herein were typically polycrystalline. As shown in FIG. 6, as-deposited $Cu_2O$ was predominantly (100) orientated when deposited at a solution pH of between about 8.0 and 9.1. Between about a solution of pH 9.4 and 9.9, a formed film was largely (110) orientated. With a solution pH above about 10.2, the (111) orientation became dominant.

FIG. 7 depicts different grain shapes for different orientated polycrystalline $Cu_2O$ films formed as described herein. For (100)-orientated $Cu_2O$ films (FIG. 7A), grains appeared as 4-sided pyramids with a 4-fold symmetry. Samples having a (110) orientation (FIG. 7B), depicted grains with a shape change from 4-sided pyramids to triangular prisms. For (111)-orientated $Cu_2O$ films (FIG. 7C), the grains appeared as 3-faced pyramids.

For electrochemically-deposited $Cu_2O$, crystal orientation was directed by solution pH. Crystal grains in the (100)-oriented $Cu_2O$ film (e.g., FIG. 7A) have $\{111\}$ faces, and the grains in (110)- and (111)-oriented $Cu_2O$ films (FIGS. 7B and 7C) have $\{100\}$ faces. The number of oxygen atoms per unit area is different for the (100), (110) and (111) planes in $Cu_2O$, which may explain the solution pH effect on growth rate of different crystallographic orientations.

Figure 8A:
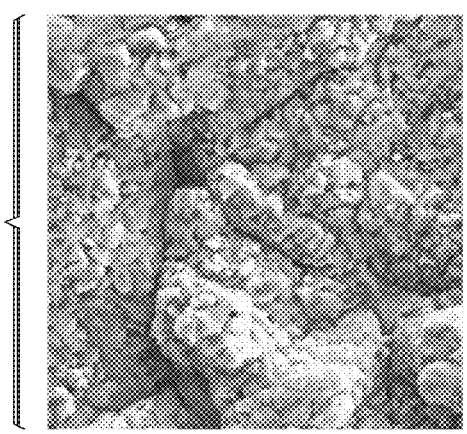
FIGS. 8A-8C depict SEM images of surface morphology of cuprous oxide films deposited at (A) pH of 7.5 and (B) pH of 11.0 and (C) two layers of cuprous oxide in which a first layer was deposited at a pH of 11.0 and a second layer was deposited at a pH of 7.5.
Figure 8B:
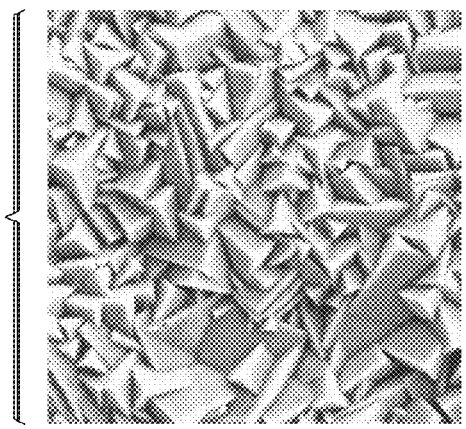
Figure 8C:
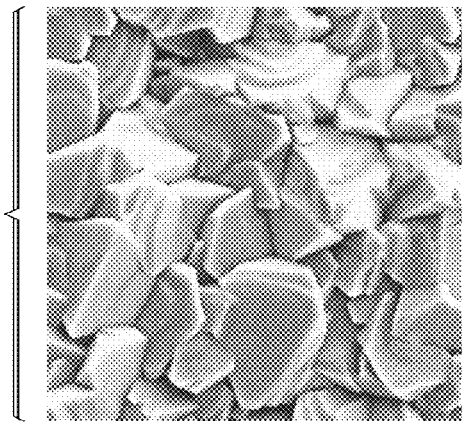

As described herein, conduction type of an electrochemically-deposited oxide of copper, such as $Cu_2O$, is controlled by pH of a solution. Copper oxide films deposited at different solution pHs were characterized using XRD and SEM. As shown in FIGS. 8A and 8B, $Cu_2O$ deposited at a pH of 7.5 appears amorphous, while at a pH of 11.0, as-deposited $Cu_2O$ is polycrystalline with a grain size up to 1 μm. As such, n-type $Cu_2O$ obtained at a low bath pH may have poorer electrical properties than p-type. The surface morphology of n-type $Cu_2O$ on p-type (FIG. 8C) is different from p-type $Cu_2O$ on Cu suggesting a change in growth kinetics.

Figure 9A:
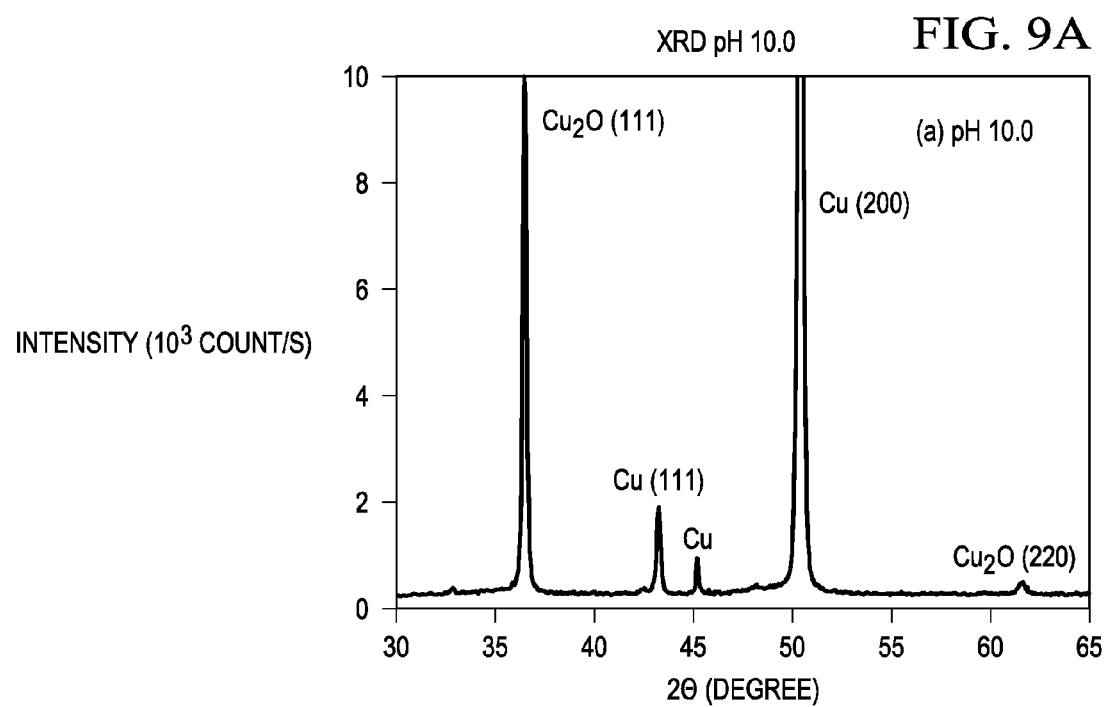
FIGS. 9A-9B depict XRD spectra of cuprous oxide films deposited at (A) pH of 10.0 and (B) pH of 7.5.
Figure 9B:
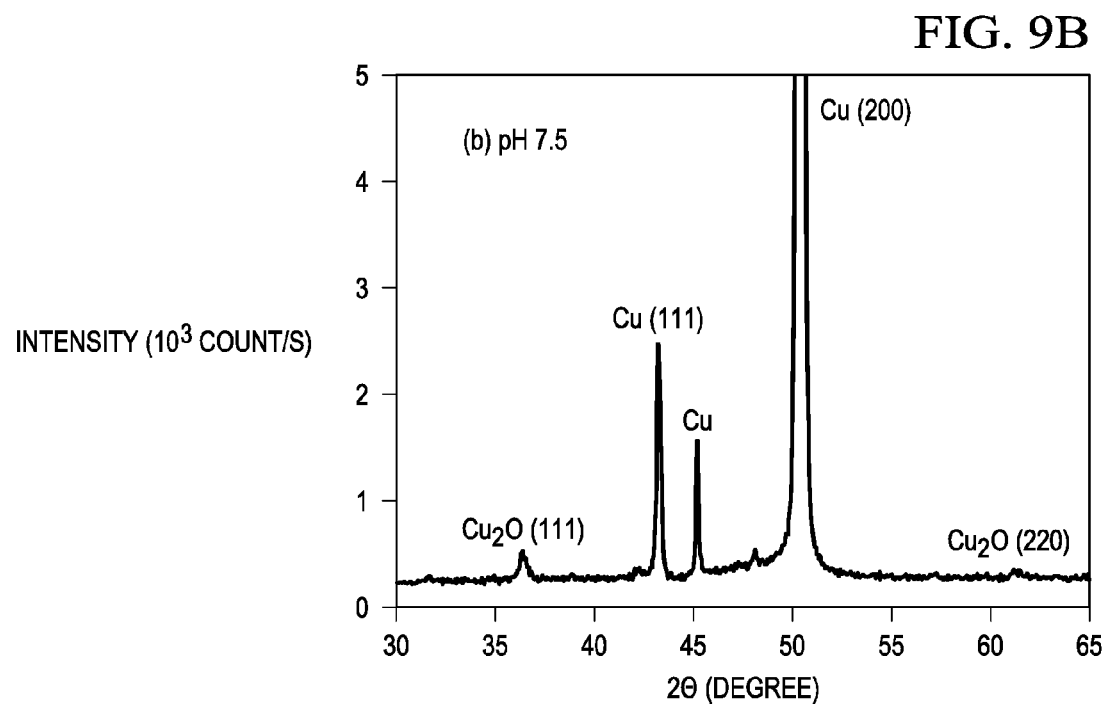

For FIG. 8, both n-type and p-type $Cu_2O$ were deposited on the same type of substrate which was a Cu foil. FIG. 9 depicts a comparison of XRD spectra from two $Cu_2O$ films, one deposited at a solution pH of 10.0 (FIG. 9A); the other at a pH of 7.5 (FIG. 9B). In FIG. 9, Cu (200) and (111) peaks are from the Cu substrate. Excluding Cu peaks, the $Cu_2O$ film deposited at pH of 10.0 is polycrystalline with a predominant (111) orientation (FIG. 9A). Although film deposited at a pH of 7.5 also shows a (111) peak (FIG. 9B), the intensity was weak and the existence of another weak peak (220) suggests an amorphous-like film. As such, XRD data agree with the SEM results in FIG. 8.

The previous descriptions of surface morphology for a representative p-n homo junction described herein is significantly different from that of n-type or p-type samples. N-type $Cu_2O$ deposited on Cu substrate appear amorphous; n-type $Cu_2O$ deposited on p-type polycrystalline $Cu_2O$ is polycrystalline with grain size up to 1 μm. An improvement in crystallinity as described herein is attributed to the different substrates and should be beneficial for improving the electrical properties of n-type $Cu_2O$.

As described herein, pH of a solution controls the amount of oxygen incorporated into a growing film (e.g., oxide of copper). This controls native point defects and conduction type of the formed film. For cuprous oxide, n-type $Cu_2O$ deposited on a Cu substrate is amorphous; p-type $Cu_2O$ on Cu is polycrystalline. And, n-type $Cu_2O$ deposited on p-type polycrystalline $Cu_2O$ is polycrystalline. Suitable metals, such as aluminum, are able to make ohmic contacts to deposited n-type $Cu_2O$ as described herein. Suitable metals, such as copper, are able to make ohmic contacts to p-type $Cu_2O$ as described herein.

Furthermore, a two-step process is adopted to deposit p-type and n-type $Cu_2O$ in sequence for the formation of a p-n homo-junction in $Cu_2O$. Photocurrent measurements demonstrate the successful deposition of n-type $Cu_2O$ on p-type $Cu_2O$. I-V characterization shows a typical rectification behavior of a p-n junction, indicating that a p-n homo-junction of $Cu_2O$ has been achieved.

The capability of fabricating p-n homo-junctions with a semiconducting oxide of copper is critical for realizing many high-performance electronic and optoelectronic devices based on semiconducting metal oxides. For solar cells based on semiconducting oxides of copper, high performance means high energy conversion efficiency. With fabrication of p-n homo-junctions by electrochemical deposition as described herein, formed p-n homo-junctions become low-cost and are realized for large-area semiconductor devices. The solution-based method is readily scaled up for large-area and high-throughput synthesis of semiconductor thin films. For commercial solar cells, as with other electronics, cost and efficiency are two important performance parameters.

Photovoltaic (PV) solar cells, which are generally based on p-n junctions, are used to convert solar energy into electricity. Solar electricity only accounts for less than 0.1% of the world electricity production due primarily to its roughly 10-fold higher cost than electricity produced from fossil fuels. Efforts to find alternative and cheaper materials for solar cell applications remain. Cuprous oxide ($Cu_2O$), with its advantages of low cost, abundant source materials, non-toxicity and suitable band gap, has been studied for solar cell applications. Unfortunately, the best reported conversion efficiency from $Cu_2O$-based solar cells is only about 2%, while the theoretical efficiency for $Cu_2O$-based solar cell use is nearly 19%. One of the main reasons for the low efficiency is that all $Cu_2O$ solar cells are based on heterogeneous junctions (hetero-junctions), where the interface between p-type $Cu_2O$ and another material is believed to constitute a significant loss mechanism for photo-carrier separation and collection. Cell efficiency in Cu2O-based photovoltaic devices is improved with the achievement of both p-type and n-type cuprous oxides and thus p-n homo-junctions of cuprous oxide as described herein.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiment and after consideration of the appended claims and drawing.

What is claimed is:

1. A device comprising:
 a first oxide of copper deposited as a thin film on a surface of a substrate;
 a second oxide of copper deposited as a thin film on the first oxide of copper, wherein the first oxide of copper is cuprous oxide from a first solution and second oxide of copper is cuprous oxide from a second solution, wherein when the as-deposited first oxide of copper is amorphous, the second as-deposited oxide of copper is polycrystalline and when the as-deposited second oxide of copper is amorphous, the first as-deposited oxide of copper is polycrystalline.

2. The device of claim 1, wherein the first oxide of copper is deposited as p-type and the second oxide of copper is deposited as n-type.

3. The device of claim 1, wherein the first oxide of copper is deposited as n-type and the second oxide of copper is deposited as p-type.

4. The device of claim 1, wherein the first solution is at a pH greater than 9.0 and the second solution is at a pH less than 7.5.

5. The device of claim 1, wherein the second solution is at a pH greater than 9.0 and the first solution is at a pH less than 7.5.

6. A device comprising:
a first oxide of copper deposited as a thin film on a surface of a substrate, wherein the first oxide of copper is deposited as one conduction type;
a second oxide of copper deposited as a thin film on the first oxide of copper, wherein the second oxide of copper is deposited as a different conduction type than that of the conduction type of the first oxide of copper, wherein the first oxide of copper is cuprous oxide from a first solution and second oxide of copper is cuprous oxide from a second solution, wherein the as-deposited second oxide of copper is polycrystalline.

7. The device of claim 6, wherein the as-deposited first oxide of copper is amorphous.

8. The device of claim 6, wherein the first solution is at a pH greater than 9.0 and the second solution is at a pH less than 7.5.

9. The device of claim 6, wherein the second solution is at a pH greater than 9.0 and the first solution is at a pH less than 7.5.

10. The device of claim 6, wherein the device includes a solid-state device, high performance electronic device and optoelectronic device.

11. A method for forming a p-n homo-junction comprising the steps of:
depositing a first oxide of copper on a surface of a substrate;
depositing a second oxide of copper on the first oxide of copper, wherein the interface between the first oxide of copper and second oxide of copper forms a p-n homo-junction and wherein the first oxide of copper is cuprous oxide deposited from a first solution and second oxide of copper is cuprous oxide deposited from a second solution, wherein conduction type of the first oxide of copper is controlled by pH of the first solution, wherein conduction type of the second oxide of copper is controlled by pH of the second solution; and
processing to form a solid-state device.

12. The method of claim 11, wherein depositing the first oxide of copper is depositing the oxide of copper as p-type and depositing the second oxide of copper is depositing the oxide of copper as n-type.

13. The method of claim 11, wherein depositing the first oxide of copper is depositing the oxide of copper as n-type and depositing the second oxide of copper is depositing the oxide of copper as p-type.

14. The method of claim 11, wherein depositing the first oxide of copper includes depositing cuprous oxide from a solution at a pH greater than 9.0 and depositing the second oxide of copper includes depositing cuprous oxide from a solution at a pH less than 7.5.

15. The method of claim 11, wherein depositing the first oxide of copper is depositing cuprous oxide from a solution at a pH less than 7.5 and depositing the second oxide of copper is depositing cuprous oxide from a solution at a pH greater than 9.0.

16. The method of claim 11 further comprising processing to form a device selected from the group consisting of a solid-state device, high performance electronic device and optoelectronic device.

17. A method of forming a device having one or more p-n homo-junctions, wherein the method includes sequential deposition of an oxide of copper from solution on at least one surface of a substrate, wherein conduction type of the oxide of copper is controlled by pH of the solution.

18. A p-n homo-junction formed on a substrate, wherein a film of p-type $Cu_2O$ is deposited in solution on a copper substrate, wherein as-deposited $Cu_2O$ is polycrystalline with a grain size of up to 1 micrometer.

19. A p-n homo-junction formed on a substrate, wherein the p-n homo-junction comprises n-type $Cu_2O$ that is deposited on p-type polycrystalline $Cu_2O$, wherein as-deposited n-type $Cu_2O$ is polycrystalline with a grain size of up to 1 micrometer.

* * * * *